US009136497B2

(12) United States Patent
Muccini et al.

(10) Patent No.: US 9,136,497 B2
(45) Date of Patent: *Sep. 15, 2015

(54) ORGANIC ELECTROLUMINESCENCE GENERATING DEVICES

(71) Applicant: Michele Muccini, Bologna (IT)

(72) Inventors: Michele Muccini, Bologna (IT); Paul Heremans, Leuven (BE); Johan Lieven Hendrik Reynaert, Bissegem (BE); Raymond Ziessel, Souffelweyersheim (FR); Aline Hepp, Darmstadt (DE); Roland Schmechel, Darmstadt (DE); Heinz Von Seggern, Darmstadt (DE); Holger Heil, Bad Soden-Salmuenster (DE)

(73) Assignee: E.T.C. S.R.L., Bologna (BO) (IT)

( * ) Notice: Subject to any disclaimer, the term of this patent is extended or adjusted under 35 U.S.C. 154(b) by 39 days.

This patent is subject to a terminal disclaimer.

(21) Appl. No.: 14/173,684

(22) Filed: Feb. 5, 2014

(65) Prior Publication Data

US 2014/0151673 A1 Jun. 5, 2014

Related U.S. Application Data

(63) Continuation of application No. 13/928,140, filed on Jun. 26, 2013, now Pat. No. 8,686,410, which is a continuation of application No. 13/541,653, filed on Jul. 3, 2012, now Pat. No. 8,497,501, which is a continuation of application No. 10/550,860, filed as application No. PCT/EP2004/003111 on Mar. 24, 2004, now abandoned.

(60) Provisional application No. 60/458,847, filed on Mar. 28, 2003.

(51) Int. Cl.
*H01L 29/08* (2006.01)
*H01L 51/50* (2006.01)
*H01L 51/52* (2006.01)

(52) U.S. Cl.
CPC ........ *H01L 51/5092* (2013.01); *H01L 51/5088* (2013.01); *H01L 51/5296* (2013.01)

(58) Field of Classification Search
USPC ......................................................... 257/40
See application file for complete search history.

(56) References Cited

U.S. PATENT DOCUMENTS

| 5,977,718 | A  | * | 11/1999 | Christensen  | 315/169.1 |
| 6,452,207 | B1 | * | 9/2002  | Bao          | 257/40    |
| 8,497,501 | B2 | * | 7/2013  | Muccini et al. | 257/40  |
| 8,686,410 | B2 | * | 4/2014  | Muccini et al. | 257/40  |
| 2002/0167280 | A1 | * | 11/2002 | Hayashi et al. | 315/169.3 |

* cited by examiner

*Primary Examiner* — Mark Tornow
(74) *Attorney, Agent, or Firm* — Steinfl & Bruno LLP (57) ABSTRACT

An electroluminescence generating device comprising a channel of organic semiconductor material, said channel being able to carry both types of charge carriers, said charge carriers being electrons and holes; an electron electrode, said electron electrode being in contact with said channel and positioned on top of a first side of said channel layer or within said channel layer, said electron electrode being able to inject electrons in said channel layer; a hole electrode, said hole electrode being spaced apart from said electron electrode, said hole channel and positioned on top of within said channel layer, said hole electrode being able to inject holes into said channel; a control electrode positioned on said first side or on a second side of said channel; whereby light emission of said electroluminescence generating device can be acquired by applying an electrical potential difference between said electron electrode and said hole electrode.

27 Claims, 5 Drawing Sheets

Figure 9.a and 9.b

ORGANIC ELECTROLUMINESCENCE GENERATING DEVICES

CROSS REFERENCE TO RELATED APPLICATIONS

The present application is a U.S. Continuation Application of U.S. application Ser. No. 13/928,140 filed on Jun. 26, 2013, which, in turn, is a U.S. Continuation Application of U.S. application Ser. No. 13/541,653 filed on Jul. 3, 2012, issued as U.S. Pat. No. 8,497,501 on Jul. 30, 2013, which, in turn, is a U.S. Continuation Application of U.S. application Ser. No. 10/550,860 filed on Jul. 10, 2006, which, in turn, is the U.S. national stage of International Application No. PCT/EP2004/003111 filed on Mar. 24, 2004, which, in turn, claims priority to U.S. Provisional Application No. 60/458,847 filed on Mar. 28, 2003, all of which are incorporated herein by reference in their entirety.

FIELD OF THE INVENTION

The present invention is related to the field of organic and polymer electronics, more specifically it is related to the field of organic light-emitting devices.

BACKGROUND OF THE INVENTION

Organic electroluminescence generating devices are typically fabricated by sandwiching one or more organic layers between conductive electrodes. Upon application of an electric field, negative charges are injected into the organic layer or organic layers from one electrode, and positive charges are injected into the organic layer or organic layers from the other electrode. Injected charges travel across the organic layer or organic layers until when they radiatively recombine to emit light.

Figure 1:
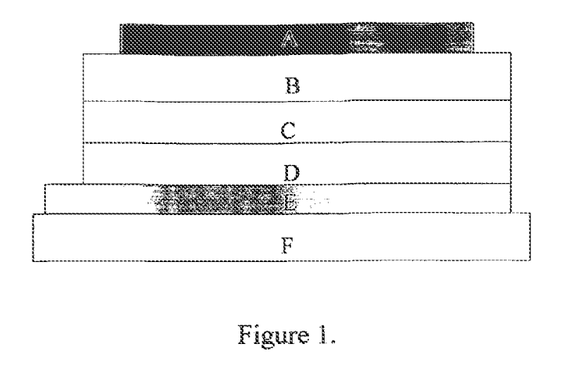
FIG. 1 is a cross section view of a prior art light-emitting device with two electrodes, wherein A is a cathode electrode, B is an organic light-emitting layer, C is an organic semiconductor layer, D is a hole injection layer, E is an anode electrode and F is a glass substrate.
Figure 2:
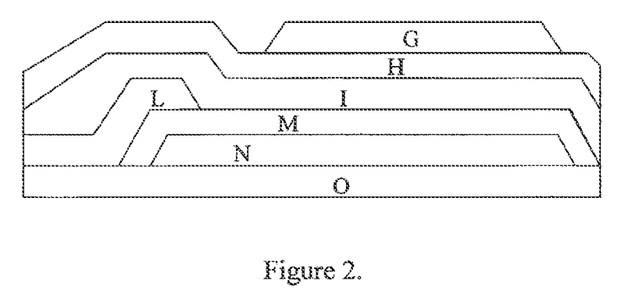
FIG. 2 is a cross section view of a prior art light-emitting device with three electrodes, wherein G is a cathode electrode, H is an organic light-emitting layer, I is an organic semiconductor transport layer, L is a source electrode, M is a gate dielectric layer, N is a transparent gate electrode and O is a glass substrate.

Examples of prior art organic electroluminescence generating devices are vertical stacks of organic layers sandwiched between two electrodes as illustrated in FIG. 1. An alternate example of prior art organic electroluminescence generating devices comprises three electrode devices where conductive electrodes injecting negative and positive charges into the organic layers are vertically displaced and separated by one or more organic layers. Injected charges travel across the vertical stack of organic layers until they radiatively recombine to emit light. An illustrative example of such structure is shown in FIG. 2.

The vertical displacement of the charge injecting electrodes requires that charge carriers travel across organic layers thereby limiting charge carriers mobility. It is known in the art that charge carrier mobilities in most organic thin films are significantly higher in a plane parallel to the substrate than in a direction perpendicular to the substrate, when these planes correspond to deposited organic layers.

AIM OF THE INVENTION

An aim of the present invention is to provide novel electroluminescence generating devices which advantageously combines charge carriers mobility occurring in a plane parallel to the substrate, thereby taking full advantage of the higher in-plane charge carriers mobility, simplified device fabrication with simultaneous fabrication of charge injecting electrodes, and electrical characteristics controlled by the controlling electrode.

Figure 3:
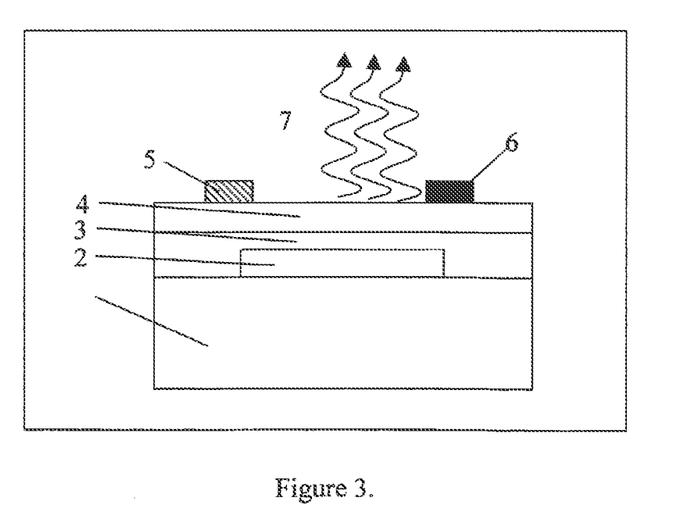
FIG. 3 is a cross section view of an electroluminescence generating device of the present invention, wherein 1 is a substrate, 2 is a controlling electrode, 3 is a dielectric layer, 4 is a channel comprising layers of organic semiconductors, 5 is a hole injecting electrodes, 6 is an electron injecting electrodes, 7 is electroluminescence.
Figure 4:
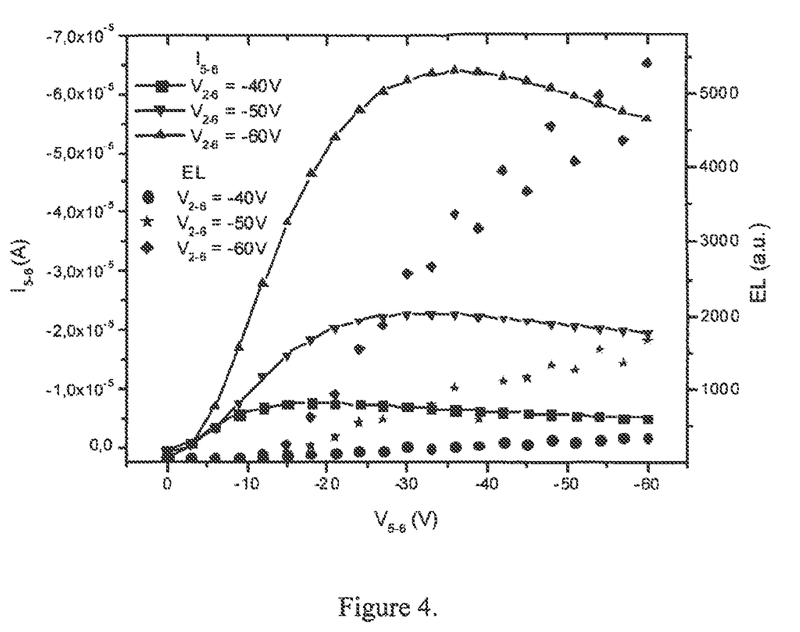
FIG. 4 is a graph illustrating the current between electrodes 5 and 6 and the corresponding generated electroluminescence as a function of the voltage between electrodes 5 and 6 for a constant voltage between electrodes 2 and 6 of the electroluminescence generating device of FIG. 3 in the case when the current of one type of charge carriers (holes in FIG. 4) dominates over the current of the other type of charge carriers (electrons in FIG. 4).
Figure 5:
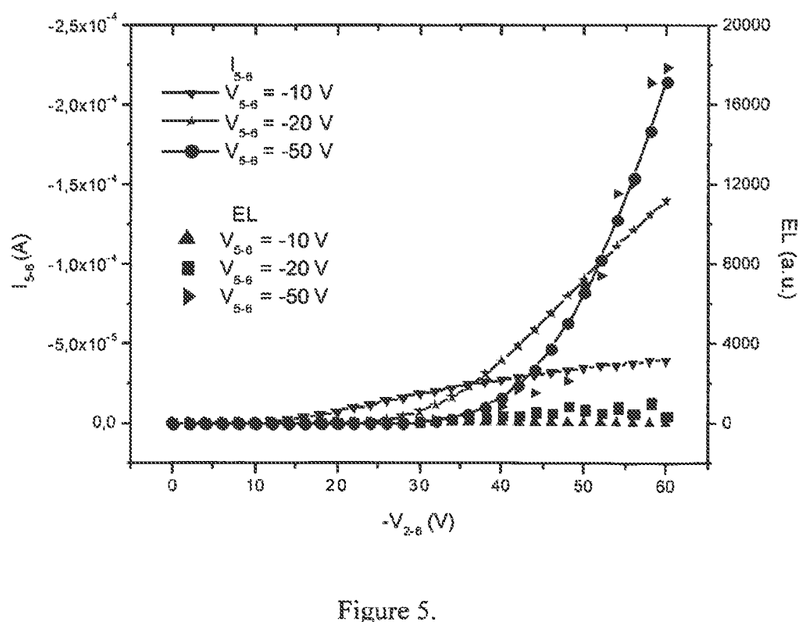
FIG. 5 is a graph illustrating the current between electrodes 5 and 6 and the corresponding generated electroluminescence as a function of the voltage between electrodes 2 and 6 for a constant voltage between electrodes 5 and 6 of the electroluminescence generating device of FIG. 3 in the case when the current of one type of charge carriers (holes in FIG. 5) dominates over the current of the other type of charge carriers (electrons in FIG. 5).
Figure 6:
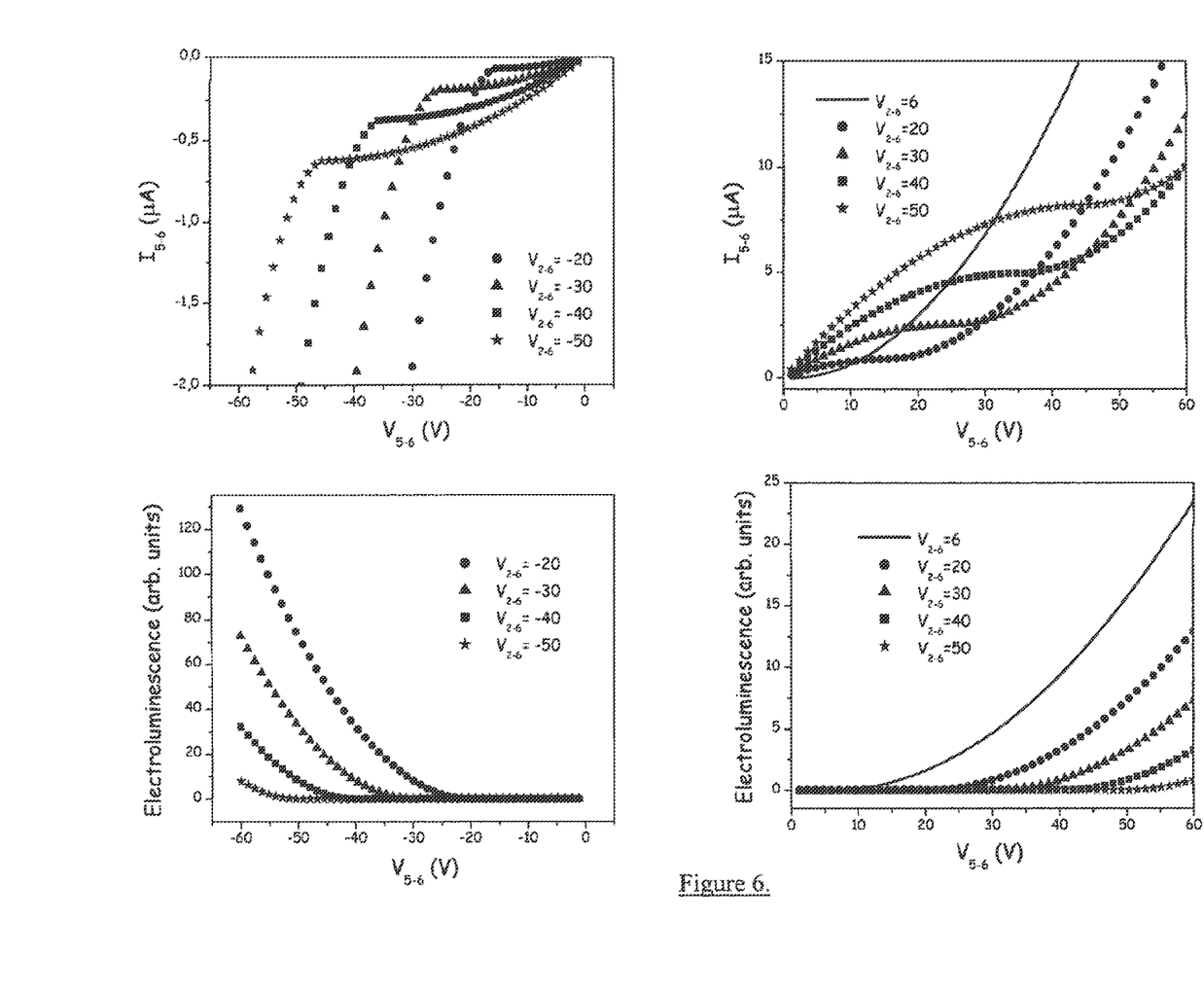
FIG. 6 is a graph illustrating the current between electrodes 5 and 6 (Top) and the corresponding generated electroluminescence (Bottom) as a function of the voltage between electrodes 5 and 6 for a constant voltage between electrodes 2 and 6 of the electroluminescence generating device of FIG. 3 in the case when the device is operated in ambipolar mode, i.e. simultaneous p- and n-channels are formed. For negative bias between electrodes 2 and 6, typical p-channel characteristics are observed when the bias between electrodes 5 and 6 is negative and the absolute value of the voltage between electrodes 5 and 6 is smaller or equal to the absolute value of the voltage between electrodes 2 and 6. Increasing the absolute value of the voltage between electrodes 5 and 6, the current between electrodes 5 and 6 increases due to electron injection in the device and ambipolar operation. Similarly, for positive bias between electrodes 2 and 6, typical n-channel characteristics are observed when the bias between electrodes 5 and 6 is positive and the value of the voltage between electrodes 5 and 6 is smaller or equal to the value of the voltage between electrodes 2 and 6. Increasing the value of the voltage between electrodes 5 and 6, the current between electrodes 5 and 6 increases due to hole injection in the device and ambipolar operation.

This aim and other aims that will become apparent from the following disclosure are reached by the electroluminescence generating devices of the present invention, comprising a thin layer, that is further referred to as the channel, comprising at least one layer of an organic semiconductor, and three or more electrodes. At least one electrode is suitable for injecting one type of charge carriers (e.g. holes), at least one electrode is suitable for injecting the other type of charge carriers (e.g. electrons) and at least one electrode, that will be referred to as the controlling electrode, is suitable to control the charge injection and/or the charge recombination within the channel and/or the current flow between at least two of the above electrodes. The electrodes for injecting one type of charge carriers (e.g., holes) into the channel and the electrodes for injecting the other type of charge carriers (e.g. electrons) into the channel are preferably positioned in an essentially horizontal plane along the channel. The controlling electrode is preferably separated from the organic semiconductor by a dielectric layer. The injected charge carriers of opposite sign recombine radiatively to generate light. An illustrative view of a light-emitting device of the present invention is illustrated in FIG. 3.

SUMMARY OF THE INVENTION

The present invention provides an electroluminescence generating device comprising:
a. a channel of organic semiconductor material, the channel being able to carry both types of charge carriers, the charge carriers being electrons and holes;
b. an electron electrode, the electron electrode being in contact with the channel and positioned on top of a first side of the channel layer or within the channel layer, the electron electrode being able to inject electrons in the channel layer;
c. a hole electrode, the hole electrode being spaced apart from the electron electrode, the hole electrode being in contact with the channel and positioned on top of the first side of the channel layer or within the channel layer, the hole electrode being able to inject holes into the channel;
d. a control electrode positioned on the first side or on a second side of the channel;
whereby light emission of the electroluminescence generating device can be acquired by applying an electrical potential difference between the electron electrode and the hole electrode.

Advantageously the electroluminescence generating device comprises further a dielectric layer between the channel and the control electrode.

This dielectric layer preferrably comprises at least one material selected from the group consisting of silicon oxide, alumina, polyimide and polymethylmetacrylate In preferred embodiments at least one of the electron electrode and the hole electrode comprises at least one different material which is not comprised in the other one.

The electron electrode preferably comprises one or more elements selected from the group consisting of Au, Ca, Mg, Al, In, Perovskite Manganites ($Re_{1-x}A_xMnO_3$).

Preferably the hole electrode comprises at least one material selected from the group consisting of Au, indium tin oxide, Cr, Cu, Fe, Ag, poly(3,4-ethylenedioxythiophene) combined with polystyrene sulfonate), Perovskite Manganites ($Re_{1-x}A_xMnO_3$).

The channel can comprise at least one material selected from the group consisting of small molecule materials, polymers and metal complexes.

Advantageously the channel comprises at least one material selected from the group consisting of tetracene, pentacene, perylenes, terthiophene, tetrathiophene, quinquethiophene, sexithiophene, bora-diazaindacene, polyphenylenevinylene, polyfluorene, polythiophene and porphyrins.

In certain embodiments according to the present invention, the channel comprises an amorphous semiconductor material In other embodiments the channel comprises a poly-crystalline semiconductor material In advantageous embodiments, the channel comprising poly-crystalline semiconductor material has a crystal grain size and the hole electrode and the electron electrode are spaced apart at a distance smaller then the grain size.

Advantageously the hole electrode and the electron electrode are spaced apart at a distance between 5 nm and 5 microns.

In certain embodiments according to the present invention, leading to higher light-output per device, electron electrode and the hole electrode have digitated structures comprising a regular repetition of a basic finger structure, and are positioned such that the basic finger structures of respectively hole and electron electrodes are alternating each other, and is characterised by two in-plane distances P and R between the basic finger structures.

Advantageously the distances P and R are equal.

In certain embodiments the control electrode is an injection control electrode, the injection control electrode being positioned on the second side of the channel, whereby the application of an electrical potential difference between the control electrode and the hole electrode or electron electrode, facilitates the injection of charge carriers into the channel.

In other embodiments the control electrode is a current control electrode, the current control electrode being positioned on the second side of the channel, whereby the application of an electrical potential difference between the control electrode and the electron and/or hole electrode allows to control the current of at least one type of charge carriers.

The channel can comprise more then one sublayers.

In certain embodiments, the channel comprises an electron injection type sublayer, able to facilitate injection of electrons, a hole injection type sublayer, able to facilitate injection of holes, and a recombination type sublayer, able to facilitate recombination of the charge carriers.

The devices according to the present invention can further comprise optical confinement and/or waveguiding layers on the first and/or the second side of the channel.

The devices according to the present invention can further comprise optical resonating structures or cavities on the first and/or the second side of the channel.

The devices according to this invention can comprise a flexible or rigid substrate.

The channel can be formed by sublimation of small molecules.

The channel can be formed by simultaneous sublimation of at least two moieties.

The channel can also be formed by solution processing of one or more soluble and/or polymeric materials.

The channel can also be formed by a combination of sublimation and solution processing This channel can be formed by thermal, chemical or physical treatment of pre-deposited organic semiconductors.

It can also be manufactured with printing techniques.

The devices according to the present invention make optimal use of a method for generating electroluminescence, by recombination of electrons and holes injected in the channel from the electron electrode and hole electrode.

They advantageously combine the fact of higher charge carrier mobilities when occurring in a plane parallel to the substrate. The devices are easy to fabricate. At least one controlling electrode is present to control the electrical and light-emission characteristics of the light-emitting device.

BRIEF DESCRIPTION OF DRAWINGS

FIG. 9.a is a detail picture of an alternating interdigitized structure of calcium and gold contacts. The organic semiconductor material on top of these contacts is tetracene. FIG. 9.b is the negative image of light-emission from the tetracene layer in this structure when the contacts are voltage-biased according to the measurement shown in FIG. 11.

MODES FOR CARRYING OUT THE INVENTION

In a preferred embodiment the device has three electrodes. A first electrode is suitable for injecting one type of charge carriers (e.g. holes), a second electrode is suitable for injecting the other type of charge carriers (e.g. electrons) and a third controlling electrode is suitable to control the charge injection, the charge recombination and the current flow between the first and the second electrodes. The controlling electrode is preferably separated from the semiconductor by a dielectric layer. The injected charge carriers of opposite sign recombine radiatively to generate light.

In another embodiment the device has at least two controlling electrodes. In one embodiment one controlling electrode can be used to control the current flow of one type of charge carriers and another controlling electrode can be used to control the current flow of the other type of charge carriers.

In another embodiment one controlling electrode is used to control the injection of one type of the charge carriers and a second controlling electrode is used to control the injection of the other type of the charge carriers.

In another embodiment one controlling electrode is used to control the spatial distribution of one type of the injected charge carriers and a second controlling electrode is used to control the spatial distribution of the other type of the injected charge carriers.

In another embodiment one controlling electrode is used to control the current flows and a second controlling electrode is used to control the location of the charge carrier recombination zone within the organic semiconductor layer.

A controlling electrode can be used to control the injection of a type of charge carriers.

Figure 7:
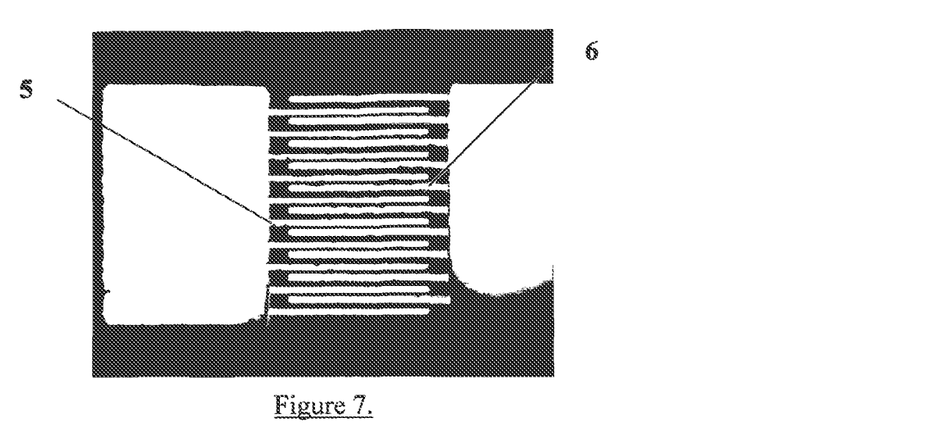
FIG. 7 is a photograph of the top view of an electroluminescent device according to the present invention, showing electrode fingers. Fingers '5' are the hole-injecting electrodes of FIG. 3, and are made of Au. Fingers '6' are the electron-injecting electrodes of FIG. 3 and are made of Ca. In the area in between the fingers is the electroluminescent organic material. The controlling electrode '2' of FIG. 3 is not visible in FIG. 7, as it is covered by a gate dielectric and by the structures visible in the photograph.
Figure 8:
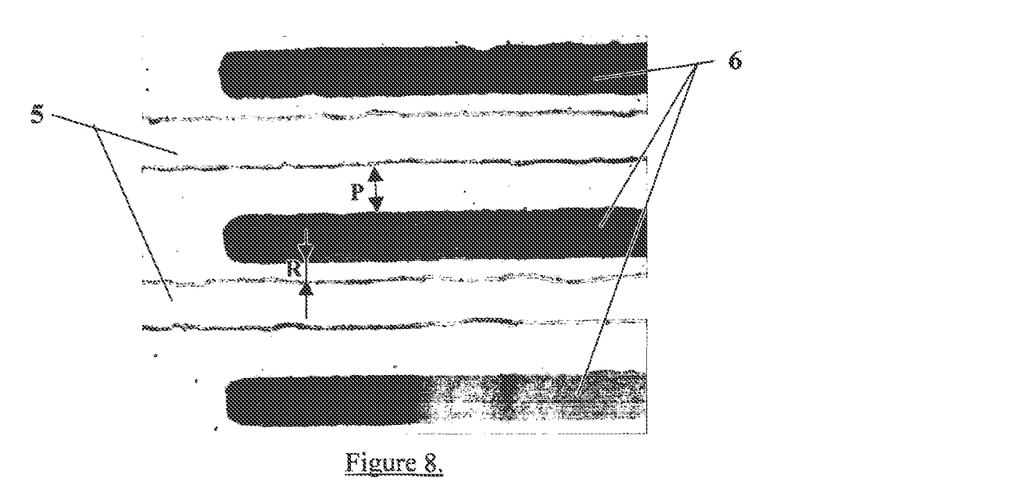
FIG. 8 is a photograph similar to FIG. 7 but with a larger magnification, showing Au fingers '5' and Ca fingers '6', with tetracene organic material in the channel between the finger contacts.

In another embodiment the electrodes which act as carrier injection electrode can be integrated in an interdigitated structure where one type of electrode, which injects one type of carriers, is alternated in space with the electrode which injects the opposed type of carriers. A purely illustrative example of such structure is represented in FIG. 7, where gold and calcium electrodes are alternatingly repeated. The device in FIG. 7 consists of a silicon substrate with silicon oxide on top. In a first step of a process for manufacturing such a device, the gold electrodes are vacuum deposited by metal evaporation through a shadow mask. Secondly, the calcium electrodes are deposited similarly through another shadow mask. Then a tetracene layer is deposited by vacuum deposition. The aluminum metal on the backside of the silicon substrate serves as controlling electrode. The carrier injection electrodes (here gold and calcium) can be situated beneath an active organic layer or above it. The performance of such device in terms of charge carrier transport and light-emission will be optimized if the distances from one type of electrode to its two electrodes adjacent (given by P and R in FIG. 8) are equal.

The injection of electrons and holes in the above structure is important for the functioning of the device. Injection of charge carriers can be mediated by impurities and hetero-species impurities and hetero-species can act to form a staircase of energy levels that facilitate charge injection into the channel. The incorporation in the channel of impurities and hetero-species can therefore be used to facilitate the injection of one or both types of charge carriers. Examples of impurities are atoms, ions, molecules different from the main moiety of the channel. Also doping atoms or molecules can be used as such impurities. Prior art shows that doping atoms or molecules introduced in a semiconductor undergo an ionisation process and leave a charged particle (atom or molecule) that changes the potential distribution, which effect can be used to facilitate injection of a type of carriers into a semiconductor.

Figure 11:
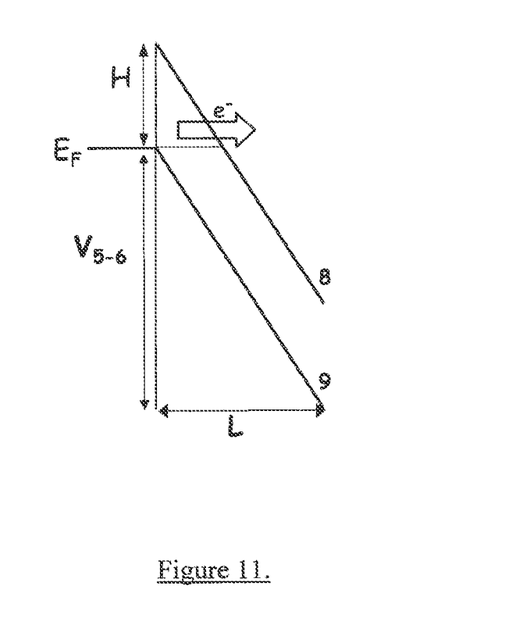
FIG. 11 is a schematic representation of a possible injection mechanism of electrons from an injecting electrode to an organic layer, driven by the voltage applied between electrodes 5 and 6 of FIG. 3. The large electric field at the injecting contact induces a local distortion of the organic material electronic levels (Lowest Unoccupied Molecular Orbital (LUMO) (8) and Highest Occupied Molecular Orbital (HOMO) (9) levels) that facilitates charge carriers injection (electrons (e⁻) in FIG. 11) via a tunneling process from the Fermi level ($E_F$) of the injecting electrode to the level 8 of the organic material.

Other means to facilitate charge carrier injection include the use of a large electric field at the injecting contact. Such favourable field can be created for instance by the electrode configuration, by the electrode shape, by the creation of an accumulation of charge carriers. A schematic representation of the possible role of the electric field in assisting charge carrier injection is shown in FIG. 11.

Charge carrier injection can also be facilitated by the use of a material for the injecting electrode that has a low barrier against injection of a charge carrier type in a channel of the device. Examples of materials that can be used to fabricate the injecting electrodes are Au, Ca, Mg, Al, In, Perovskite Manganites ($Re_{1-x}A_xMnO_3$), indium tin oxide, Cr, Cu, Fe, Ag and poly(3,4-ethylenedioxythiophene) combined with polystyrene sulfonate). Charge carrier injection into the channel can further be facilitated by interposing one or several layers of material that form a staircase of electronic levels between the energy level of the injecting electrode and the energy level required for injection in a semiconductor.

Figure 9:
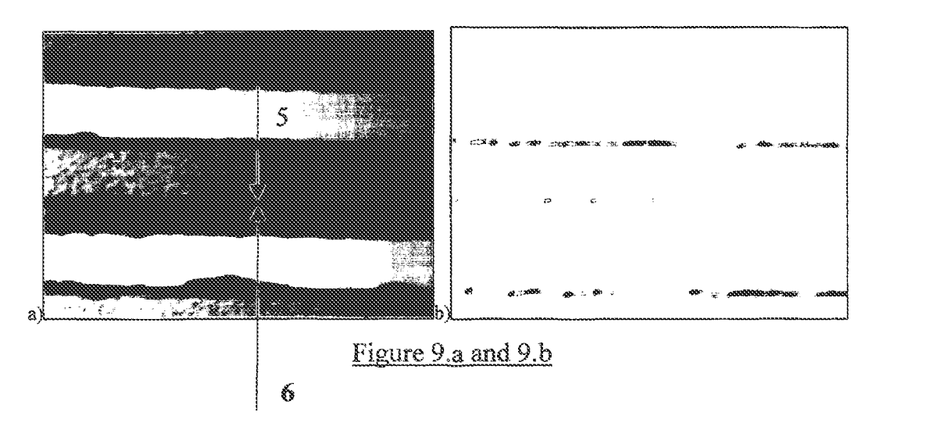
Figure 10:
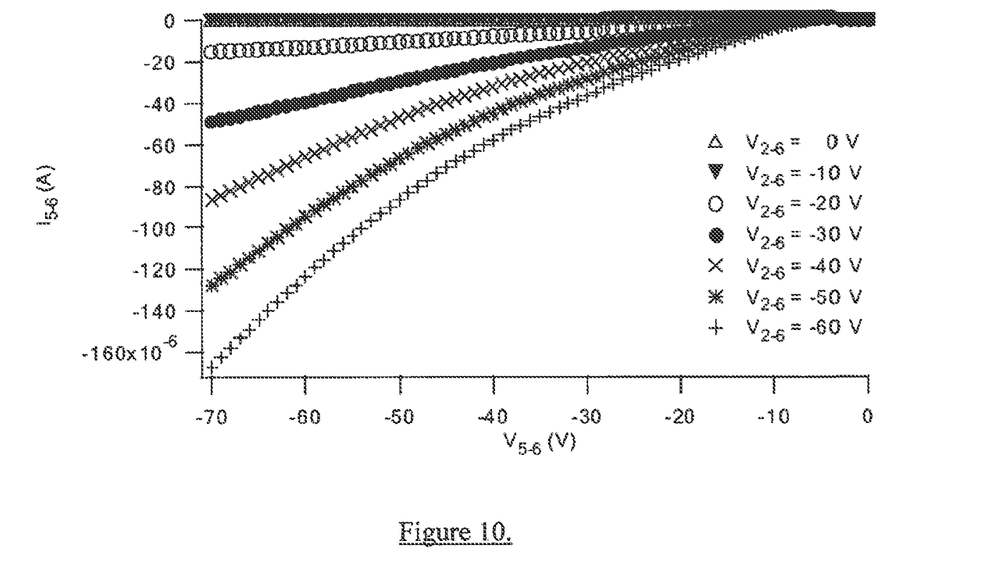
FIG. 10 represents a measurement on a device structure with alternating gold and calcium injection contacts deposited on the silicon oxide surface layer of a silicon substrate. The silicon substrate is metallized with aluminum, which serves as a controlling electrode. The electrode numbering is according to the one used in FIG. 3.

Charge carrier injection and electroluminescence can also be facilitated by designing the injection electrodes to fit the morphology of an organic material which is used as active layer. The morphology is determined by the intrinsic property of the organic materials and the deposition method. The distance between the injection electrodes can be smaller than the average grain size of poly-crystalline films (typically in the range of 20 nanometers to 5 micrometers). In such case, carriers of opposite type (electrons and holes) can be injected in one grain by the electrodes '5' and '6' directly into a single grain of the poly-crystalline organic semiconductor. As an example, FIG. 9 shows a gold metal and calcium electrode adjacent to each other with a distance of less than one micrometer between them. This list of methods to facilitate injection of charge carriers is not intended to be limitative, and a person skilled in the art can extend it to more methods.

An aim of this embodiment of the invention is to provide an electroluminescence generating device comprising a channel having at least one layer of an organic semiconductor, at least two electrodes for injecting two different types of charge carriers, and at least one controlling electrode, and a method to facilitate the injection of at least one type of charge carriers into the channel. The channel of the device of the present invention consists of at least one layer of organic semiconductor. An organic semiconductor can consist of small molecules (whereby it is meant molecules that can be processed by sublimation), preferably tetracene, pentacene, perylenes, oligothiophens (terthiophenes, tetrathiophene, quinquethiophene or sexithiophene), bora-diazaindacene fluorophores; it can be a polymer, such as polyphenylenevinylene, polyfluorene or polythiophene; it can be a metal complex such as Pt-octaethylporphyrin. The list of materials is not intended to be limitative, but only to provide examples. The organic semiconductor used in the channel can consist of small molecules and polymers, which have been chemically, electrochemically or physically processed to show n-type (or alternatively p-type) behavior in combination or in place of the p-type (or alternatively n-type) transport characteristics.

In another embodiment, the channel can consist of several layers of organic semiconductors, each of them with a specific function in the device. In an embodiment the channel consists of two layers of organic semiconductors. In one layer of organic semiconductor the injection and transport of one type of charge carriers preferentially occurs, in the other layer of organic semiconductor the injection and transport of the other type of charge carriers preferentially occurs. Charges of opposite sign recombine radiatively in one of the two layers of organic semiconductors or at the interface between them to generate light.

In another embodiment the channel consists of three layers of organic semiconductors. In one layer of organic semiconductor the injection and transport of one type of charge carriers preferentially occurs, in another layer of organic semiconductor the injection and transport of the other type of charge carriers preferentially occurs. In the third layer of organic semiconductor or at one of the interfaces between the third and the other two layers the charges of opposite sign recombine radiatively to generate light.

Organic layers or doping moieties can be inserted in the channel to facilitate and optimize light emission via, for example, energy transfer processes from the organic species in which the charges first recombine to the organic layers or doping moieties which act as energy acceptors. The energy transfer process can be used to separate zones within the channel with high electric fields and high density of free carriers from the zone where exciton recombination and light emission occurs, which would result in improved light emission efficiency of the device.

In another embodiment the channel consist of a co-evaporated layer of two or more materials. The materials may have specific charge transport, charge recombination, energy transfer and light emission functions in the device.

In another embodiment the channel consist of two co-evaporated materials, each acting as a transport mean for one type of charge carriers in the channel. One type of charge carrier is injected in one material which is in contact with an injecting electrode and is transported via an interpenetrated path towards the other electrode. The other type of charge carrier is injected by the other electrode in the other material and is transported via an interpenetrated path towards the other electrode. The two types of charges recombine in the channel and generate light emission.

In another embodiment the channel is formed by solution processing a polymer or a polymer blend that creates an interpenetrating network of p-type and n-type materials.

The channel can further be realized by several coplanar layers of organic semiconductors, each of them with a specific function (charge injection, charge transport, charge recombination, energy transfer and light emission, just to mention some possible functions) in the device.

The channel can also be realized by a combination of coplanar layers of organic semiconductors and vertically stacked layers of organic semiconductors.

Transport of a type of charge carriers through the entire channel may not be necessary, provided that injected charges into the channel recombine radiatively with charges of opposite sign to emit light.

Examples of materials for injecting electrodes are gold, calcium, aluminium, magnesium. Examples of dielectrics are silicon dioxide (also in its porous form), alumina, polyimide, polymethylmetacrylate. The list of materials is not intended to be limitative, but only to provide examples.

In a further improvement of the device, optical confinement layers are added to the device structure below and/or above the channel. Preferred means of optical confinement comprise a structure of material with lower refractive index than that of the channel, such as to provide optical confinement by waveguiding, and a reflector, such as a distributed Bragg reflector or a metal mirror.

Depending on the channel characteristics, on the materials used and on the optical confinement layers, light can be emitted isotropically or in specific directions or within a specific solid angle.

The device according to the invention can be made in different configurations. In a first configuration, a controlling electrode or controlling electrodes are deposited first on a substrate, followed by a dielectric, followed by injecting electrodes, followed by a channel layer that comprises an organic semiconductor. In an alternative embodiment, an injecting electrode is deposited on top of a channel, as shown in FIG. 3. In yet another embodiment, a dielectric and a controlling electrodes are deposited on top of a channel.

The devices according to the invention are operated by applying a first appropriate bias voltage to a controlling electrode, and injecting electrons from a first electrode and holes from a second electrode, while maintaining a second bias voltage between the latter two electrodes. The first and second bias voltages can be continuous voltages. In an alternative operation method, they can also be pulsed voltages. The devices can be operated at room temperature. In alternative, they can be operated in the temperature range from 1° Kelvin to 450° Kelvin.

The light output of the device can be perpendicular to the plane of the substrate and the layer sequel described above. It can also be guided in the plane of the substrate, in particular when optical confinement layers as described above are provided. The light output can be incoherent.

The light output can also be coherent and light output can be laser emission. In an embodiment of lasers based on the above described device structure suitable organic semiconductors, optical confinement structures, optical resonators or cavities are used so to provide coherent light output and lasing.

The device structure of the present invention is compatible with planar technology and can easily be integrated into electronic and optoelectronic Integrated Circuits. The potential of nanotechnology, in particular for down-scaling the relevant device features and for nanostructuring the channel, can be used to optimize and tailor the device characteristics.

The use of the above mentioned devices range from nanoscale light sources for nanophotonics and nano-optoelectronics, optoelectronic Integrated Circuits, lasers applications, displays, information technologies, ambient and automotive illumination. The potential for applications, in particular for intense light generation sources, arises from the specific device geometry and working mechanism, which allows to better control charge carriers injection and to limit the destructive interaction of the light-emitting excitons with the charge carriers and the electric field in the channel. The list of applications and technologies is not intended to be limitative, but only to provide examples.

The disclosures in U.S. Ser. No. 60/458,847 from which this application claims priority are incorporated herein by reference.

The invention claimed is:

1. An electroluminescence generating device comprising:
a channel comprising at least one layer of an organic semiconductor material, said channel being able to carry both types of charge carriers, said charge carriers being electrons and holes;
an electron injector electrode, said electron injector electrode being in contact with said channel and positioned on top of a first side of said channel or within said channel, said electron injector electrode being able to inject electrons in said channel;
a hole injector electrode, said hole injector electrode being spaced apart from said electron injector electrode, said hole injector electrode being in contact with said channel and positioned on top of a first side of said channel or within said channel, said hole injector electrode being able to inject holes in said channel, each of said electron injector electrode and said hole injector electrode being positioned in an essentially horizontal plane along said channel; and
a control electrode positioned on said first side or on a second side of said channel, said control electrode being suitable for controlling the charge injection, the current flow and the charge recombination between the electron injector electrode and the hole injector electrode,
said electroluminescence generating device being able to emit light by applying an electrical potential difference between said electron injector electrode and said hole injector electrode, wherein said electron injector electrode and said hole injector electrode have a different material composition.

2. The device according to claim 1, further comprising a dielectric layer between said channel and said control electrode.

3. The device according to claim 2, wherein said dielectric layer comprises at least one material selected from the group consisting of silicon oxide, alumina, polyimide and polymethylmethacrylate.

4. The device according to claim 1, wherein said electron injector electrode comprises one or more elements selected from the group consisting of Au, Ca, Mg, Al, In, and Perovskite Manganites.

5. The device according to claim 1, wherein said hole injector electrode comprises at least one material selected from the group consisting of Au, indium tin oxide, Cr, Cu, Fe, Ag, poly(3,4-ethylendioxythiophene) combined with poly(styrene sulfonate), and Perovskite Manganites.

6. The device according to claim 1, wherein said channel comprises at least one material selected from the group consisting of small molecule materials, polymers and metal complexes.

7. The device according to claim 6, wherein said channel comprises at least one material selected from the group consisting of tetracene, pentacene, perylenes, terthiophene, tetrathiophene, quinquethiophene, sexithiophene, bora-diazaindacene, polyphenylenevinylene, polyfluorene, polythiophene and porphyrins.

8. The device according to claim 1, wherein said semiconductor organic material is a polycrystalline semiconductor organic material having a crystal grain size and said hole injector electrode and said electron injector electrode are spaced apart at a distance smaller than said crystal grain size.

9. The device according to claim 1, wherein said hole injector electrode and said electron injector electrode are spaced apart at a distance between 5 nm and 5 microns.

10. The device according to claim 1, wherein said electron injector electrode and said hole injector electrode have digitated structures comprising a regular repetition of a basic finger structure, and are positioned such that said basic finger structures of said basic finger structures of respectively hole and electron injector electrodes are alternating each other, and is characterized by two in-plane distances P and R between the basic finger structures.

11. The device according to claim 10 wherein said P and R are equal.

12. The device according to claim 1, wherein said control electrode is an injection control electrode, said injection control electrode being positioned on said second side of said channel and being suitable to facilitate the injection of charge carriers into said channel upon the application of an electrical potential difference between said control electrode and said hole injector electrode or an electron injector electrode.

13. The device according to claim 1, wherein said control electrode is a current control electrode, said current control electrode being positioned on said second side of said channel whereby being suitable for controlling the current of at least one type of charge carriers upon the application of an electrical potential difference between said control electrode and said electron and/or hole injector electrode.

14. The device according to claim 1, wherein said channel comprises three layers of organic semiconductors.

15. The device according to claim 14, wherein the three layers of organic semiconductors are:
a first electron injection and transport layer;
a second recombination organic semiconductor layer; and
a third hole injection and transport organic semiconductor layer.

16. The device according to claim 15, wherein said three layers of organic semiconductors are coplanar layers of organic semiconductors.

17. The device according to claim 1, where said at least one layer of organic semiconductor material are a plurality of coplanar layers of organic semiconductor material.

18. The device according to claim 1, further comprising optical confinement and/or waveguiding layers on said first and/or second side of said channel.

19. The device according to claim 18, wherein the optical confinement and/or waveguiding layers have a lower refractive index than the refractive index of the channel.

20. The device according to claim 1, further comprising optical resonating structures or cavities on said first and/or second side of said channel.

21. The device according to claim 1, further comprising a flexible or rigid substrate.

22. The device according to claim 1, wherein the control electrode comprises at least two control electrodes.

23. The device according to claim 1, wherein all the injector electrodes are on the same first side of the channel opposite to the control electrode on the second side of the channel.

24. The device according to claim 1, wherein said electron electrode comprises one or more elements selected from the group consisting of Mg, In, and Perovskite Manganites.

25. The device according to claim 1, wherein said hole electrode comprises at least one material selected from the group consisting of indium tin oxide, Fe, Ag, poly(3,4-ethylendioxythiophene) combined with poly(styrene sulfonate), and Perovskite Manganites.

26. The device according to claim 1, further comprising one or more materials forming a staircase of electronic levels between a) an energy level of the electron injection electrode and/or the hole injection electrode and b) an energy level required for said charge injection into the channel.

27. The device according to claim 26, wherein said one or more materials are in form of layers.

* * * * *